United States Patent
Kim et al.

(10) Patent No.: US 10,627,456 B2
(45) Date of Patent: Apr. 21, 2020

(54) MAGNETIC FIELD SHIELDING APPARATUS

(71) Applicant: Electronics and Telecommunications Research Institute, Daejeon (KR)

(72) Inventors: Byung Chan Kim, Daejeon (KR); Sang-Won Kim, Daejeon (KR); Seong-Min Kim, Daejeon (KR); Jung Ick Moon, Daejeon (KR); Sang Bong Jeon, Daejeon (KR); In Kui Cho, Daejeon (KR); Hyung Do Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/599,908

(22) Filed: May 19, 2017

(65) Prior Publication Data

US 2018/0235112 A1  Aug. 16, 2018

(30) Foreign Application Priority Data

Feb. 10, 2017 (KR) .......................... 10-2017-0018444

(51) Int. Cl.
| | | |
|---|---|---|
| *G01R 33/025* | (2006.01) | |
| *H02J 7/02* | (2016.01) | |
| *H02J 7/00* | (2006.01) | |
| *H02J 50/10* | (2016.01) | |
| *H02J 50/70* | (2016.01) | |
| *H01F 27/36* | (2006.01) | |
| *H05K 9/00* | (2006.01) | |

(52) U.S. Cl.
CPC .......... *G01R 33/025* (2013.01); *H02J 7/0042* (2013.01); *H02J 7/025* (2013.01); *H02J 50/10* (2016.02); *H02J 50/70* (2016.02); *H01F 27/365* (2013.01); *H04R 2209/022* (2013.01); *H05K 9/0075* (2013.01)

(58) Field of Classification Search
CPC ............ H05K 9/0075; H04R 2209/022; G01R 33/42–33/422
See application file for complete search history.

(56) References Cited

U.S. PATENT DOCUMENTS

| | | | |
|---|---|---|---|
| 6,060,971 A | * | 5/2000 | Sasaki .................. C30B 15/305 117/32 |
| 8,987,610 B2 | | 3/2015 | Kim et al. |
| 2016/0242332 A1 | | 8/2016 | Kwak et al. |

FOREIGN PATENT DOCUMENTS

| | | |
|---|---|---|
| JP | 1995147496 A | 6/1995 |
| KR | 1020140021102 A | 2/2014 |
| KR | 1020150086786 A | 7/2015 |

* cited by examiner

*Primary Examiner* — Ramon M Barrera
(74) *Attorney, Agent, or Firm* — William Park & Associates Ltd.

(57) ABSTRACT

Disclosed is a magnetic field shielding apparatus including an energy transmitter configured to generate a magnetic field, an energy receiver configured to receive the magnetic field generated by the energy transmitter, and a magnetic shield configured to shield a leaked magnetic field that is not received by the energy receiver, the magnetic shield including at least one closed region through which the leaked magnetic field passes, and at least one open region including a protrusion through which the leaked magnetic field moves to an inside of the magnetic field shielding apparatus after absorbed into the closed region.

11 Claims, 8 Drawing Sheets

MAGNETIC FIELD SHIELDING APPARATUS

CROSS-REFERENCE TO RELATED APPLICATION(S)

This application claims the priority benefit of Korean Patent Application No. 10-2017-0018444 filed on Feb. 10, 2017, in the Korean Intellectual Property Office, the disclosure of which is incorporated herein by reference for all purposes.

BACKGROUND

1. Field

One or more example embodiments relate to a magnetic field shielding apparatus and method for reducing a strength of a magnetic field radiated/leaked during wireless power transmission.

2. Description of Related Art

In general, magnetic field shielding minimizes energy to be transmitted to an ambient device or human by blocking a magnetic field present in a space surrounded by a material having a high permeability.

The existing magnetic field shielding technology has difficulties in implementing perfect shielding since a method therefor needs to change based on a type and a structure of device to which the magnetic field shielding technology is to be applied.

Thus, magnetic field shielding technology for reducing a strength of a leaked magnetic field by shielding unnecessary magnetic fields generated from magnetic field sources having various shapes and structures.

SUMMARY

An aspect provides a magnetic field shielding apparatus, that is, an apparatus that may protect an ambient device and user and maintain a transmission efficiency by controlling a magnetic field to move along a path from an outside of a magnetic field shielding apparatus to an inside thereof using magnetic field shielding materials to minimize an influence of a leaked magnetic field that is not received by an energy receiver during wireless energy transmission from an energy transmitter to the energy receiver.

According to an aspect, there is provided a magnetic field shielding apparatus including an energy transmitter configured to generate a magnetic field, an energy receiver configured to receive the magnetic field generated by the energy transmitter, and a magnetic shield configured to shield a leaked magnetic field that is not received by the energy receiver. The magnetic shield may include at least one closed region through which the leaked magnetic field passes, and at least one open region including a protrusion through which the leaked magnetic field moves to an inside of the magnetic field shielding apparatus after absorbed into the closed region.

The closed region may include a first closed region into which the leaked magnetic field is absorbed or through which the leaked magnetic field passes from the inside of the magnetic field shielding apparatus to an outside thereof, and a second closed region through which the magnetic field passing through the first closed region passes from the outside of the magnetic field shielding apparatus to the inside thereof.

A portion of the open region through which an electronic device configured to obtain energy from the energy transmitter and the energy receiver is to be inserted may be configured to have a greater width than a remaining portion of the open region.

The protrusion may be configured to protrude toward the inside of the magnetic field shielding apparatus within a range not interfering with the magnetic field that moves from the energy transmitter to the energy receiver.

The magnetic shield may be provided in a multilayer structure in which one or more shielding materials having different permeabilities are alternately disposed.

The shielding materials may be disposed at a preset interval to be spaced apart from each other.

The energy transmitter and the energy receiver may each be disposed at a preset interval to be spaced apart from the magnetic shield.

The energy receiver may be configured to receive a portion of the leaked magnetic field that moves from an outside of the magnetic field shielding apparatus to the inside thereof through the open region.

According to another aspect, there is also provided a magnetic field shielding apparatus including a magnetic shield configured to shield a magnetic field generated by a magnetic field generating apparatus disposed in the magnetic field shielding apparatus. The magnetic shield may include at least one closed region through which the generated magnetic field passes, and at least one open region including a protrusion through which the generated magnetic field moves to an inside of the magnetic field shielding apparatus after absorbed into the closed region.

A portion of the open region through which the magnetic field generating apparatus is to be inserted may be configured to have a greater width than a remaining portion of the open region.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
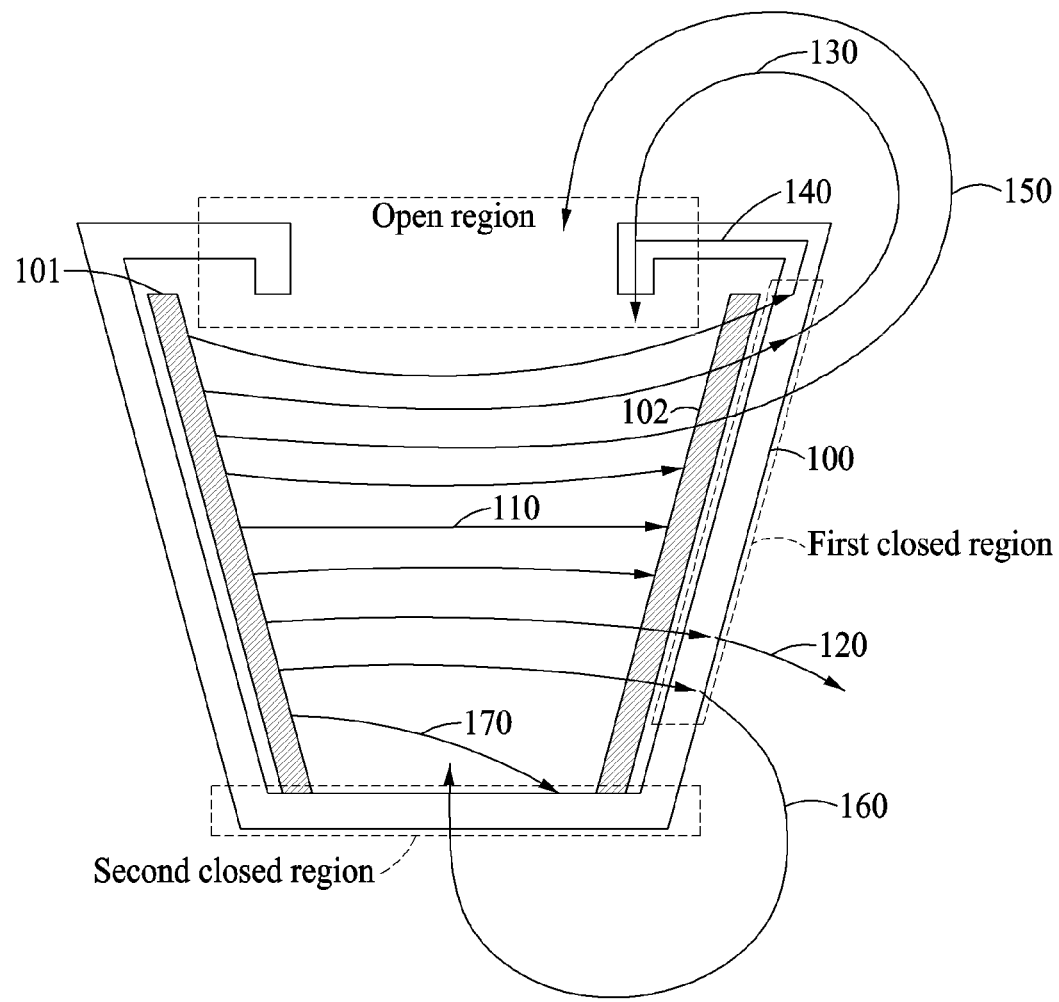
FIG. 1 illustrates a magnetic field shielding apparatus including an energy transmitter and an energy receiver according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

FIG. 1 illustrates a magnetic field shielding apparatus including an energy transmitter and an energy receiver according to an example embodiment.

Referring to FIG. 1, a magnetic field shielding apparatus may include a magnetic shield 100, an energy transmitter 101, and an energy receiver 102. In an example, the energy transmitter 101 and the energy receiver 102 may correspond to a wireless charging apparatus.

The energy transmitter 101 may be attached to the magnetic shield 100 or a preset distance spaced apart from the magnetic shield 100. The energy transmitter 101 may generate a magnetic field toward the energy receiver 102. The magnetic field generated by the energy transmitter 101 may move toward the energy receiver 102.

The energy receiver 102 may be attached to the magnetic shield 100 or a preset distance spaced apart from the magnetic shield 100. The energy receiver 102 may receive the magnetic field generated by the energy transmitter 101. In this example, a portion of the magnetic field that is not received by the energy receiver 102 may pass through the energy receiver 102.

The magnetic shield 100 may include a first closed region, a second closed region, and an open region. For example, a cross section of the magnetic shield 100 may correspond to a trapezoidal shape such that a width of the open region is greater than a width of the second closed region. The first closed region may absorb or allow leaked portions of the magnetic field passing through the energy receiver 102 to pass.

The open region may enable the magnetic field being absorbed into the first closed region or passing through the first closed region to move to an inside of the magnetic field shielding apparatus again through a protrusion. In this example, the protrusion disposed in the open region may protrude toward the inside of the magnetic field shielding apparatus within a range not interfering with a path of the magnetic field that moves from the energy transmitter 101 to the energy receiver 102. Further, an electronic device configured to obtain energy from the energy transmitter 101 and the energy receiver 102 disposed in the magnetic field shielding apparatus may be inserted through the open region of the magnetic field shielding apparatus. The second closed region may enable the magnetic field passing through the first closed region to move to the inside of the magnetic field shielding apparatus again.

A portion of the magnetic field generated by the energy transmitter 101 that moves along a path 110 may be received by the energy receiver 102.

A portion of the magnetic field generated by the energy transmitter 101 that moves along a path 120 may not be received by the energy receiver 102, and may pass through the energy receiver 102. The portion passing through the energy receiver 102 may perpendicularly meet the first closed region of the magnetic shield 100 along the path 120. In this example, a distance between the energy receiver 102 and the first closed region of the magnetic shield 100 may reduce a strength of the magnetic field that reaches the first closed region of the magnetic shield 100. The portion of the magnetic field that perpendicularly meets the first closed region of the magnetic shield 100 may pass through the first closed region of the magnetic shield 100 along the path 120. Further, the portion of the magnetic field passing through the first closed region of the magnetic shield 100 may move to a free space along the path 120.

A portion of the magnetic field generated by the energy transmitter 101 that moves along a path 130 may not be received by the energy receiver 102, and may pass through the energy receiver 102. The portion passing through the energy receiver 102 may meet the first closed region of the magnetic shield 100 at a non-perpendicular angle along the path 130, and the portion that meets the first closed region of the magnetic shield 100 at the non-perpendicular angle may pass through the first closed region of the magnetic shield 100 along the path 130. In this example, the distance between the energy receiver 102 and the first closed region of the magnetic shield 100 may reduce the strength of the magnetic field that reaches the first closed region of the magnetic shield 100.

The portion of the magnetic field passing through the first closed region of the magnetic shield 100 may proceed into the free space along the path 130. In this example, the portion of the magnetic field proceeding into the free space may move to the inside of the magnetic field shielding apparatus again through the protrusion disposed in the open region of the magnetic shield 100 along the path 130 by a shielding material having a higher permeability than the free space. Here, the portion of the magnetic field that moves to the inside of the magnetic field shielding apparatus again may be received by the energy receiver 102, thereby increasing a reception efficiency of the energy receiver 102.

A portion of the magnetic field generated by the energy transmitter 101 that moves along a path 140 may not be received by the energy receiver 102, and may pass through the energy receiver 102. The portion passing through the energy receiver 102 may meet the first closed region of the magnetic shield 100 at a non-perpendicular angle, and the portion that meets the first closed region of the magnetic shield 100 at the non-perpendicular angle may be absorbed into the first closed region of the magnetic shield 100 along the path 140. In this example, the distance between the energy receiver 102 and the first closed region of the magnetic shield 100 may reduce the strength of the magnetic field that reaches the first closed region of the magnetic shield 100.

The portion of the magnetic field absorbed into the first closed region of the magnetic shield 100 may move to the inside of the magnetic field shielding apparatus again through the protrusion disposed in the open region of the magnetic shield 100 along the path 140. Here, the portion of the magnetic field that moves to the inside of the magnetic field shielding apparatus again may be received by the energy receiver 102, thereby increasing the reception efficiency of the energy receiver 102.

A portion of the magnetic field generated by the energy transmitter 101 that moves along a path 150 may not be received by the energy receiver 102, and may pass through the energy receiver 102. The portion passing through the energy receiver 102 may meet the first closed region of the magnetic shield 100 at a non-perpendicular angle, and the portion that meets the first closed region of the magnetic shield 100 at the non-perpendicular angle may pass through the first closed region of the magnetic shield 100 along the path 150. In this example, the distance between the energy receiver 102 and the first closed region of the magnetic shield 100 may reduce the strength of the magnetic field that reaches the first closed region of the magnetic shield 100.

The portion of the magnetic field passing through the first closed region of the magnetic shield 100 may proceed into the free space. In this example, the portion of the magnetic field proceeding into the free space may move to the inside of the magnetic field shielding apparatus again through the open region of the magnetic shield 100 along the path 150 by the shielding material having the higher permeability than the free space. Here, the portion of the magnetic field that moves to the inside of the magnetic field shielding apparatus again may be received by the energy receiver 102, thereby increasing the reception efficiency of the energy receiver 102.

A portion of the magnetic field generated by the energy transmitter 101 that moves along a path 160 may not be received by the energy receiver 102, and may pass through the energy receiver 102. The portion passing through the energy receiver 102 may meet the first closed region of the magnetic shield 100 at a non-perpendicular angle, and the portion that meets the first closed region of the magnetic shield 100 at the non-perpendicular angle may pass through the first closed region of the magnetic shield 100 along the path 160. In this example, the distance between the energy receiver 102 and the first closed region of the magnetic shield 100 may reduce the strength of the magnetic field that reaches the first closed region.

The portion of the magnetic field passing through the first closed region of the magnetic shield 100 may proceed into the free space. In this example, the portion of the magnetic field proceeding into the free space may move to the second closed region of the magnetic shield 100 along the path 160 by the shielding material having the higher permeability than the free space. Here, a portion of the magnetic field moving to the second closed region of the magnetic shield 100 that passes through the second closed region of the magnetic shield 100 may move to the inside of the magnetic field shielding apparatus again and be received by the energy receiver 102, thereby increasing the reception efficiency of the energy receiver 102. A remaining portion of the magnetic field moving to the second closed region of the magnetic shield 100 that does not pass through the second closed region of the magnetic shield 100 may be absorbed into the second closed region of the magnetic shield 100.

A portion of the magnetic field generated by the energy transmitter 101 that moves along a path 170 may not be received by the energy receiver 102, and may meet the second closed region of the magnetic shield 100 at a non-perpendicular angle. The portion that meets the second closed region of the magnetic shield 100 at the non-perpendicular angle may be absorbed into the second closed region of the magnetic shield 100 along the path 170.

Figure 2:
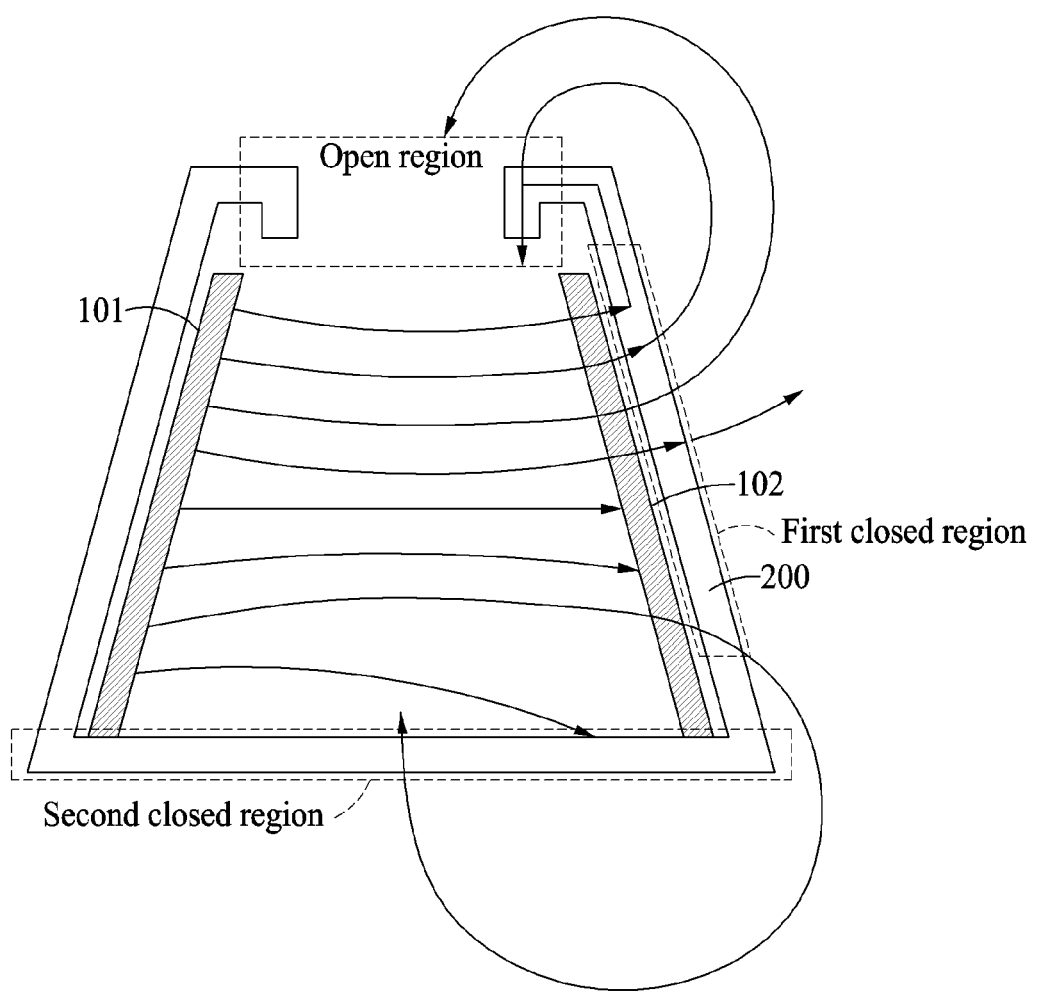
FIG. 2 illustrates a magnetic field shielding apparatus including an energy transmitter and an energy receiver according to an example embodiment.

FIG. 2 illustrates a magnetic field shielding apparatus including an energy transmitter and an energy receiver according to an example embodiment.

Referring to FIG. 2, a magnetic field shielding apparatus may include a magnetic shield 200, the energy transmitter 101, and the energy receiver 102. In an example, the energy transmitter 101 and the energy receiver 102 may correspond to a wireless charging apparatus.

The energy transmitter 101 may be attached to the magnetic shield 200 or a preset distance spaced apart from the magnetic shield 200. The energy transmitter 101 may generate a magnetic field toward the energy receiver 102. The magnetic field generated by the energy transmitter 101 may move toward the energy receiver 102.

The energy receiver 102 may be attached to the magnetic shield 200 or a preset distance spaced apart from the magnetic shield 200. The energy receiver 102 may receive the magnetic field generated by the energy transmitter 101. In this example, a portion of the magnetic field that is not received by the energy receiver 102 may pass through the energy receiver 102.

The magnetic shield 200 may include a first closed region, a second closed region, and an open region. For example, a cross section of the magnetic shield 200 may correspond to a trapezoidal shape such that a width of the open region is less than a width of the second closed region. The first closed region may absorb or allow leaked portions of the magnetic field passing through the energy receiver 102 to pass.

The open region may enable the magnetic field being absorbed into the first closed region or passing through the first closed region to move to an inside of the magnetic field shielding apparatus again through a protrusion. In this example, the protrusion disposed in the open region may protrude toward the inside of the magnetic field shielding apparatus within a range not interfering with a path of the magnetic field that moves from the energy transmitter 101 to the energy receiver 102. Further, an electronic device configured to obtain energy from the energy transmitter 101 and the energy receiver 102 disposed in the magnetic field shielding apparatus may be inserted through the open region of the magnetic field shielding apparatus. The second closed region may enable the magnetic field passing through the first closed region to move to the inside of the magnetic field shielding apparatus again.

Figure 3:
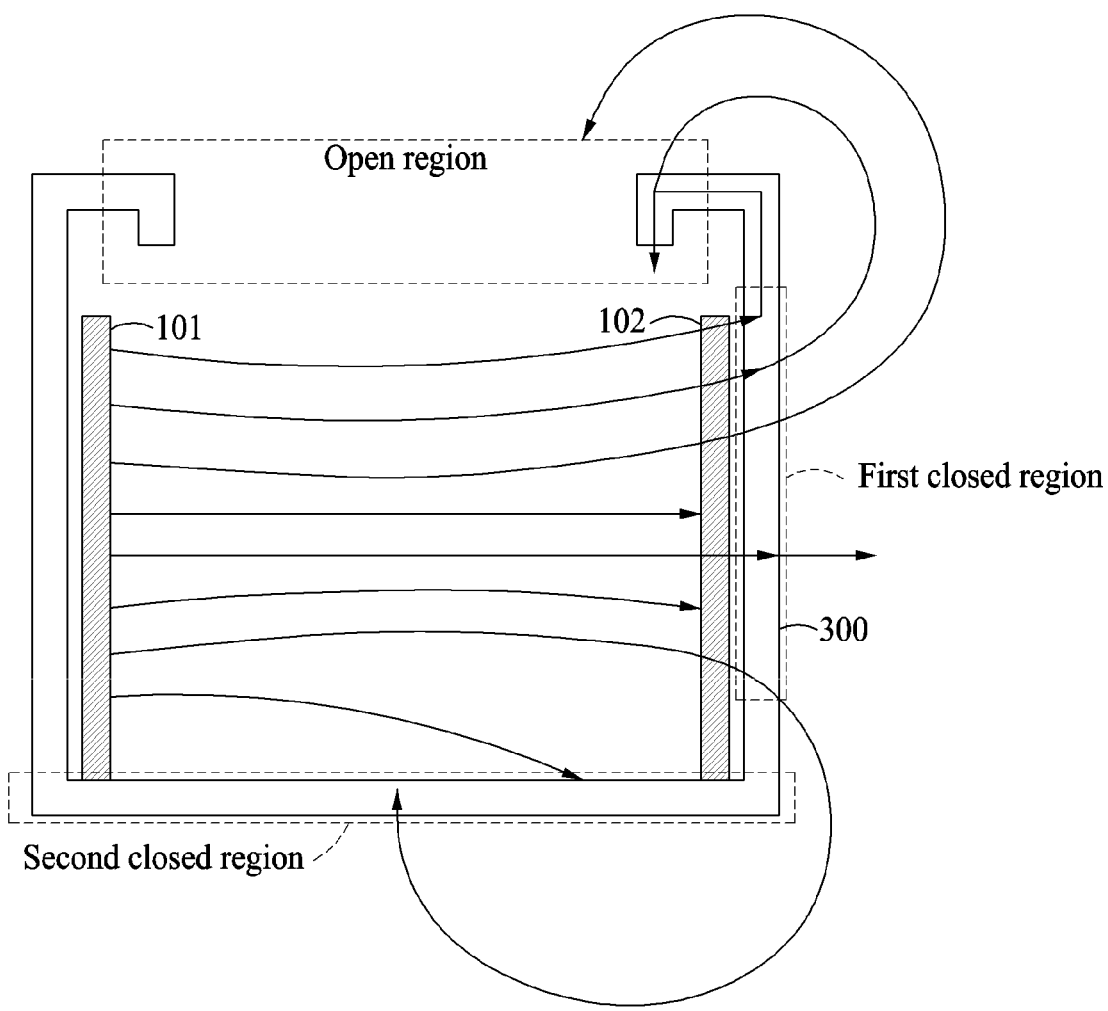
FIG. 3 illustrates a magnetic field shielding apparatus including an energy transmitter and an energy receiver according to an example embodiment.

FIG. 3 illustrates a magnetic field shielding apparatus including an energy transmitter and an energy receiver according to an example embodiment.

Referring to FIG. 3, a magnetic field shielding apparatus may include a magnetic shield 300, the energy transmitter 101, and the energy receiver 102. In an example, the energy transmitter 101 and the energy receiver 102 may correspond to a wireless charging apparatus.

The energy transmitter 101 may be attached to the magnetic shield 300 or a preset distance spaced apart from the magnetic shield 300. The energy transmitter 101 may generate a magnetic field toward the energy receiver 102. The magnetic field generated by the energy transmitter 101 may move toward the energy receiver 102.

The energy receiver 102 may be attached to the magnetic shield 300 or a preset distance spaced apart from the magnetic shield 300. The energy receiver 102 may receive the magnetic field generated by the energy transmitter 101. In this example, a portion of the magnetic field that is not received by the energy receiver 102 may pass through the energy receiver 102.

The magnetic shield 300 may include a first closed region, a second closed region, and an open region. For example, a cross section of the magnetic shield 300 may correspond to a rectangular shape such that a width of the open region is equal to a width of the second closed region. The first closed region may absorb or allow leaked portions of the magnetic field passing through the energy receiver 102 to pass. In this example, a distance between the energy receiver 102 and the first closed region may reduce a strength of the magnetic field that reaches the first closed region.

The open region may enable the magnetic field being absorbed into the first closed region or passing through the first closed region to move to an inside of the magnetic field shielding apparatus again through a protrusion. In this example, the protrusion disposed in the open region may protrude toward the inside of the magnetic field shielding apparatus within a range not interfering with a path of the magnetic field that moves from the energy transmitter 101 to the energy receiver 102. Further, an electronic device configured to obtain energy from the energy transmitter 101 and the energy receiver 102 disposed in the magnetic field shielding apparatus may be inserted through the open region of the magnetic field shielding apparatus. The second closed region may enable the magnetic field passing through the first closed region to move to the inside of the magnetic field shielding apparatus again.

Figure 4:
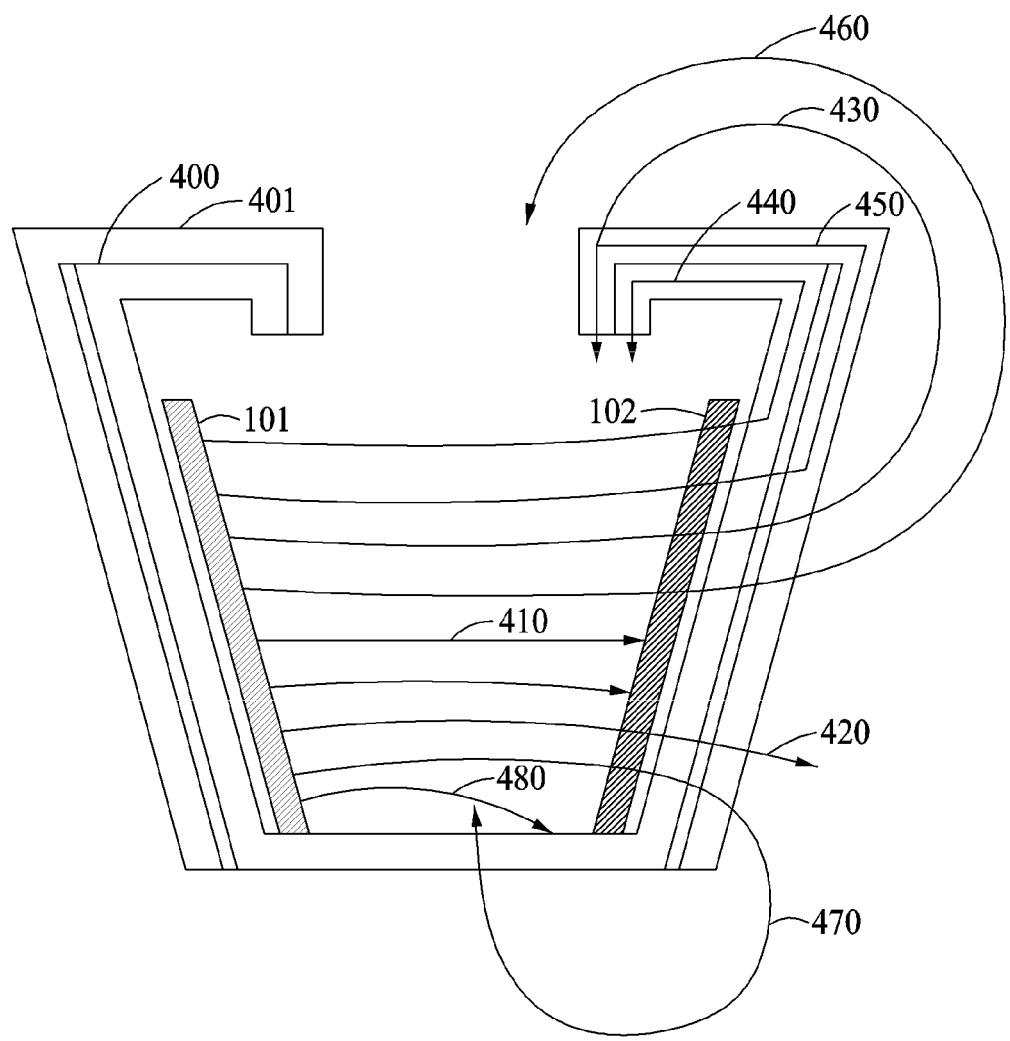
FIG. 4 illustrates a magnetic field shielding apparatus including an energy transmitter, an energy receiver, and magnetic shields provided in a multilayer structure according to an example embodiment.

FIG. 4 illustrates a magnetic field shielding apparatus including an energy transmitter, an energy receiver, and magnetic shields provided in a multilayer structure according to an example embodiment.

Referring to FIG. 4, a magnetic field shielding apparatus may include magnetic shields 400 and 401, the energy transmitter 101, and the energy receiver 102. In an example, the energy transmitter 101 and the energy receiver 102 may correspond to a wireless charging apparatus. The magnetic shield 400 and the magnetic shield 401 may have different permeabilities. Further, a multilayer structure of the magnetic shields may not be limited to shielding materials of a two-layer structure, and may include at least two layers of shielding materials having different permeabilities.

The energy transmitter 101 may be attached to the magnetic shield 400 or a preset distance spaced apart from the magnetic shield 400. The energy transmitter 101 may generate a magnetic field toward the energy receiver 102. The magnetic field generated by the energy transmitter 101 may move toward the energy receiver 102.

The energy receiver 102 may be attached to the magnetic shield 400 or a preset distance spaced apart from the magnetic shield 400. The energy receiver 102 may receive the magnetic field generated by the energy transmitter 101. In this example, a portion of the magnetic field that is not received by the energy receiver 102 may pass through the energy receiver 102.

The magnetic shields 400 and 401 may each include a first closed region, a second closed region, and an open region. For example, a cross section of each of the magnetic shields 400 and 401 may correspond to a trapezoidal shape such that a width of the open region is greater than a width of the second closed region. The first closed region of the magnetic shield 400 may absorb or allow leaked portions of the magnetic field passing through the energy receiver 102 to pass. In this example, a distance between the energy receiver 102 and the first closed region of the magnetic shield 400 may reduce a strength of a leaked portion of the magnetic field that reaches the first closed region of the magnetic shield 400.

The first closed region of the magnetic shield 401 may absorb or allow leaked portions of the magnetic field passing through the first closed region of the magnetic shield 400 to pass. In this example, a distance between the first closed region of the magnetic shield 400 and the first closed region of the magnetic shield 401 may reduce a strength of a leaked portion of the magnetic field that reaches the first closed region of the magnetic shield 401.

Further, the open region may enable the magnetic field absorbed into the first closed region of each of the magnetic shields 400 and 401 or passing through the first closed region of each of the magnetic shields 400 and 401 to move to an inside of the magnetic field shielding apparatus again through a protrusion. In this example, the protrusion disposed in the open region may protrude toward the inside of the magnetic field shielding apparatus within a range not interfering with a path of the magnetic field that moves from the energy transmitter 101 to the energy receiver 102. Further, an electronic device configured to obtain energy from the energy transmitter 101 and the energy receiver 102 disposed in the magnetic field shielding apparatus may be inserted through the open region of the magnetic field shielding apparatus. The second closed region may enable the magnetic field passing through the first closed region to move to the inside of the magnetic field shielding apparatus again.

A portion of the magnetic field generated by the energy transmitter 101 that moves along a path 410 may be received by the energy receiver 102.

A portion of the magnetic field generated by the energy transmitter 101 that moves along a path 420 may not be received by the energy receiver 102, and may pass through the energy receiver 102. The portion passing through the energy receiver 102 may perpendicularly meet the first closed region of the magnetic shield 400 along the path 420. The portion that perpendicularly meets the first closed region of the magnetic shield 400 may pass the first closed region of the magnetic shield 400 along the path 420. In this example, the distance between the energy receiver 102 and the first closed region of the magnetic shield 400 may reduce a strength of the magnetic field that reaches the first closed region of the magnetic shield 400.

The portion of the magnetic field passing through the first closed region of the magnetic shield 400 that perpendicularly meets the first closed region of the magnetic shield 401 may pass through the first closed region of the magnetic shield 401 along the path 420. In this example, a distance between the first closed region of the magnetic shield 400 and the first closed region of the magnetic shield 401 may reduce a strength of the magnetic field that reaches the first closed region of the magnetic shield 401. Further, the portion of the magnetic field passing through the first closed region of the magnetic shield 401 may move to a free space along the path 420.

A portion of the magnetic field generated by the energy transmitter 101 that moves along a path 430 may not be received by the energy receiver 102, and may pass through the energy receiver 102. The portion passing through the energy receiver 102 may meet the first closed region of the magnetic shield 400 along the path 430 at a non-perpendicular angle, and the portion that meets the first closed region of the magnetic shield 400 at the non-perpendicular angle may pass through the first closed region of the magnetic shield 400 along the path 430. In this example, the distance between the energy receiver 102 and the first closed region of the magnetic shield 400 may reduce the strength of the magnetic field that reaches the first closed region of the magnetic shield 400.

The portion passing through the first closed region of the magnetic shield 400 may meet the first closed region of the magnetic shield 401 at a non-perpendicular angle, and the portion that meets the first closed region of the magnetic shield 401 at the non-perpendicular angle may pass through the first closed region of the magnetic shield 401 along the path 430. In this example, the distance between the first closed region of the magnetic shield 400 and the first closed region of the magnetic shield 401 may reduce the strength of the magnetic field that reaches the first closed region of the magnetic shield 401.

The portion of the magnetic field passing through the first closed region of the magnetic shield 401 may proceed into the free space along the path 430. In this example, the portion of the magnetic field proceeding into the free space may move to the inside of the magnetic field shielding apparatus again through the protrusion disposed in the open region of the magnetic shield 401 along the path 430 by a shielding material having a higher permeability than the free space. Here, the portion of the magnetic field that moves to the inside of the magnetic field shielding apparatus again may be received by the energy receiver 102, thereby increasing a reception efficiency of the energy receiver 102.

A portion of the magnetic field generated by the energy transmitter 101 that moves along a path 440 may not be received by the energy receiver 102, and may pass through the energy receiver 102. The portion passing through the energy receiver 102 may meet the first closed region of the magnetic shield 400 at a non-perpendicular angle, and the portion that meets the first closed region of the magnetic shield 400 at the non-perpendicular angle may be absorbed into the first closed region of the magnetic shield 400 along the path 440. In this example, the distance between the energy receiver 102 and the first closed region of the magnetic shield 400 may reduce the strength of the magnetic field that reaches the first closed region of the magnetic shield 400.

The portion of the magnetic field absorbed into the first closed region of the magnetic shield 400 may move to the inside of the magnetic field shielding apparatus again through the protrusion disposed in the open region of the magnetic shield 400 along the path 440. Here, the portion of the magnetic field that moves to the inside of the magnetic field shielding apparatus again may be received by the energy receiver 102, thereby increasing the reception efficiency of the energy receiver 102.

A portion of the magnetic field generated by the energy transmitter 101 that moves along a path 450 may not be received by the energy receiver 102, and may pass through the energy receiver 102. The portion passing through the energy receiver 102 may meet the first closed region of the magnetic shield 400 at a non-perpendicular angle, and the portion that meets the first closed region of the magnetic shield 400 at the non-perpendicular angle may pass through the first closed region of the magnetic shield 400 along the path 450. In this example, the distance between the energy receiver 102 and the first closed region of the magnetic shield 400 may reduce the strength of the magnetic field that reaches the first closed region of the magnetic shield 400.

The portion of the magnetic field passing through the first closed region of the magnetic shield 400 may meet the first closed region of the magnetic shield 401 at a non-perpendicular angle, and the portion that meets the first closed region of the magnetic shield 401 at the non-perpendicular angle may be absorbed into the first closed region of the magnetic shield 401 along the path 450. In this example, the distance between the first closed region of the magnetic shield 400 and the first closed region of the magnetic shield 401 may reduce the strength of the magnetic field that reaches the first closed region of the magnetic shield 401.

The portion of the magnetic field absorbed into the first closed region of the magnetic shield 401 may move to the inside of the magnetic field shielding apparatus again through the protrusion disposed in the open region of the magnetic shield 401 along the path 450. Here, the portion of the magnetic field that moves to the inside of the magnetic field shielding apparatus again may be received by the energy receiver 102, thereby increasing the reception efficiency of the energy receiver 102.

A portion of the magnetic field generated by the energy transmitter 101 that moves along a path 460 may not be received by the energy receiver 102, and may pass through the energy receiver 102. The portion passing through the energy receiver 102 may meet the first closed region of the magnetic shield 400 at a non-perpendicular angle, and the portion that meets the first closed region of the magnetic shield 400 at the non-perpendicular angle may pass through the first closed region of the magnetic shield 400 along the path 460. In this example, the distance between the energy receiver 102 and the first closed region of the magnetic shield 400 may reduce the strength of the magnetic field that reaches the first closed region of the magnetic shield 400.

The portion of the magnetic field passing through the first closed region of the magnetic shield 400 may meet the first closed region of the magnetic shield 401 at a non-perpendicular angle, and the portion that meets the first closed region of the magnetic shield 401 at the non-perpendicular angle may pass through the first closed region of the magnetic shield 401 along the path 460. In this example, the distance between the first closed region of the magnetic shield 400 and the first closed region of the magnetic shield 401 may reduce the strength of the magnetic field that reaches the first closed region of the magnetic shield 401.

The portion of the magnetic field passing through the first closed region of the magnetic shield 401 may proceed into the free space. In this example, the portion of the magnetic field proceeding into the free space may move to the inside of the magnetic field shielding apparatus through the open region of each of the magnetic shields 400 and 401 along the path 460 by the shielding material having the higher permeability than the free space. Here, the portion of the magnetic field that moves to the inside of the magnetic field shielding apparatus again may be received by the energy receiver 102, thereby increasing the reception efficiency of the energy receiver 102.

A portion of the magnetic field generated by the energy transmitter 101 that moves along a path 470 may not be received by the energy receiver 102, and may pass through the energy receiver 102. The portion passing through the energy receiver 102 may meet the first closed region of the magnetic shield 400 at a non-perpendicular angle, and the portion that meets the first closed region of the magnetic shield 400 at the non-perpendicular angle may pass through the first closed region of the magnetic shield 400 along the path 470. In this example, the distance between the energy receiver 102 and the first closed region of the magnetic shield 400 may reduce the strength of the magnetic field that reaches the first closed region of the magnetic shield 400.

The portion of the magnetic field passing through the first closed region of the magnetic shield 400 may meet the first closed region of the magnetic shield 401 at a non-perpendicular angle, and the portion that meets the first closed region of the magnetic shield 401 at the non-perpendicular angle may pass through the first closed region of the magnetic shield 401 along the path 470. In this example, the distance between the first closed region of the magnetic shield 400 and the first closed region of the magnetic shield 401 may reduce the strength of the magnetic field that reaches the first closed region of the magnetic shield 401.

The portion of the magnetic field passing through the first closed region of the magnetic shield 401 may proceed into the free space. In this example, the portion of the magnetic field proceeding into the free space may move to the second closed region of the magnetic shield 400 along the path 470 by the shielding material having the higher permeability than the free space. Here, a portion of the magnetic field moving to the second closed region of the magnetic shield 400 that passes through the second closed region of the magnetic shield 400 may move to the inside of the magnetic field shielding apparatus again and be received by the energy receiver 102, thereby increasing the reception efficiency of the energy receiver 102. A remaining portion of the magnetic field moving to the second closed region of the magnetic shield 400 that does not pass through the second closed region of the magnetic shield 400 may be absorbed into the second closed region of the magnetic shield 400.

A portion of the magnetic field generated by the energy transmitter 101 that moves along a path 480 may not be received by the energy receiver 102, and may meet the second closed region of the magnetic shield 400 at a non-perpendicular angle. The portion that meets the second closed region of the magnetic shield 400 at the non-perpendicular angle may be absorbed into the second closed region of the magnetic shield 400 along the path 480.

Figure 5:
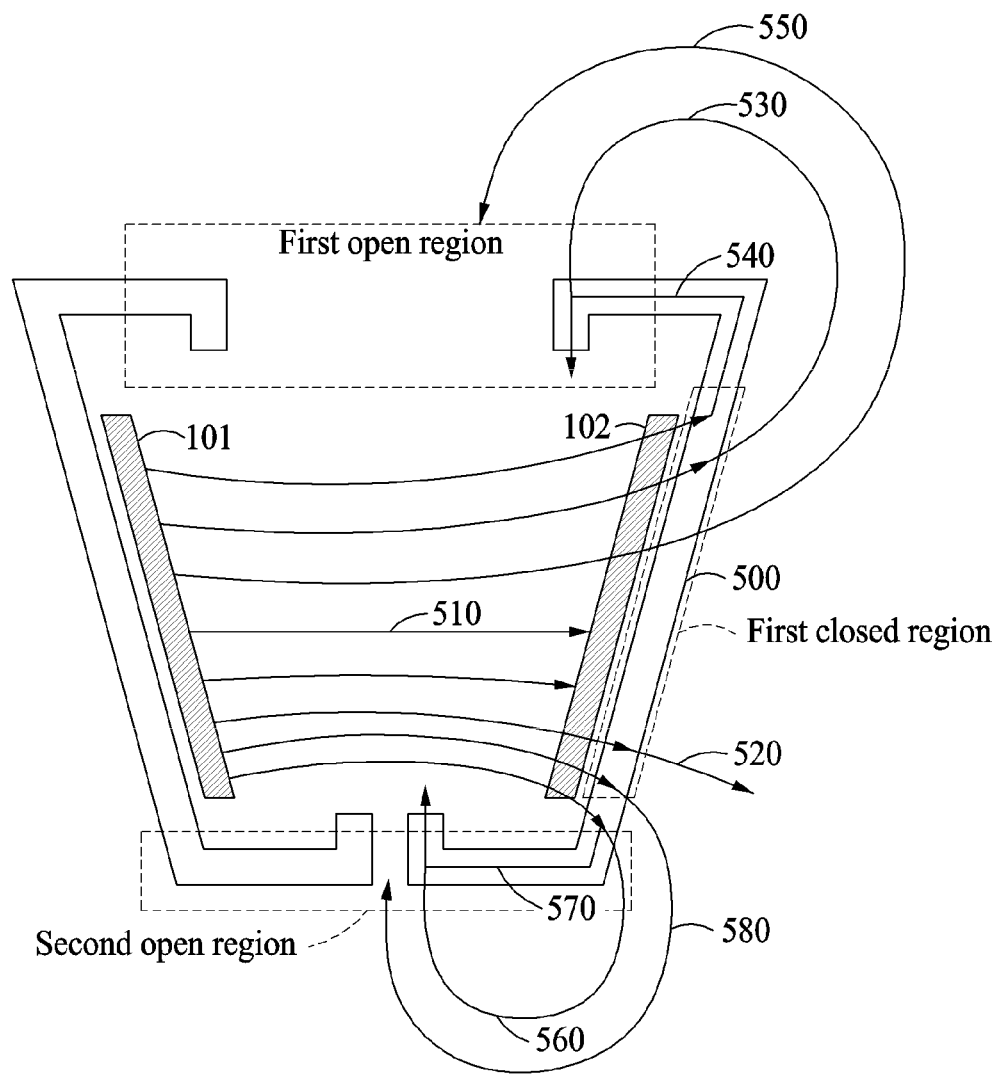
FIG. 5 illustrates a magnetic field shielding apparatus including an energy transmitter, an energy receiver, and a magnetic shield having at least two open regions according to an example embodiment.

FIG. 5 illustrates a magnetic field shielding apparatus including an energy transmitter, an energy receiver, and a magnetic shield having at least two open regions according to an example embodiment.

Referring to FIG. 5, a magnetic field shielding apparatus may include a magnetic shield 500, the energy transmitter 101, and the energy receiver 102. In an example, the energy transmitter 101 and the energy receiver 102 may correspond to a wireless charging apparatus.

The energy transmitter 101 may be attached to the magnetic shield 500 or a preset distance spaced apart from the magnetic shield 500. The energy transmitter 101 may generate a magnetic field toward the energy receiver 102. The magnetic field generated by the energy transmitter 101 may move toward the energy receiver 102.

The energy receiver 102 may be attached to the magnetic shield 500 or a preset distance spaced apart from the magnetic shield 500. The energy receiver 102 may receive the magnetic field generated by the energy transmitter 101. In this example, a portion of the magnetic field that is not received by the energy receiver 102 may pass through the energy receiver 102.

The magnetic shield 500 may include a first closed region, a first open region, and a second open region. For example, a cross section of the magnetic shield 500 may correspond to a trapezoidal shape such that a width of the first open region is greater than a width of the second open region. The first closed region may absorb or allow leaked portions of the magnetic field passing through the energy receiver 102 to pass. In this example, a distance between the energy receiver 102 and the first closed region may reduce a strength of the magnetic field that reaches the first closed region.

The first open region and the second open region may each enable the magnetic field being absorbed into the first closed region or passing through the first closed region to move to an inside of the magnetic field shielding apparatus again through a protrusion. In this example, the protrusion disposed in each of the first open region and the second open region may protrude toward the inside of the magnetic field shielding apparatus within a range not interfering with a path of the magnetic field that moves from the energy transmitter 101 to the energy receiver 102. Further, an electronic device configured to obtain energy from the energy transmitter 101 and the energy receiver 102 disposed in the magnetic field shielding apparatus may be inserted through the first open region of the magnetic field shielding apparatus.

A portion of the magnetic field generated by the energy transmitter 101 that moves along a path 510 may be received by the energy receiver 102.

A portion of the magnetic field generated by the energy transmitter 101 that moves along a path 520 may not be received by the energy receiver 102, and may pass through the energy receiver 102. The portion passing through the energy receiver 102 may perpendicularly meet the first closed region of the magnetic shield 500 along the path 520. In this example, the distance between the energy receiver 102 and the first closed region of the magnetic shield 500 may reduce the strength of the magnetic field that reaches the first closed region of the magnetic shield 500. The portion that perpendicularly meets the magnetic shield 500 may pass through the first closed region of the magnetic shield 500 along the path 520. Further, the portion passing through the first closed region of the magnetic shield 500 may move to a free space along the path 520.

A portion of the magnetic field generated by the energy transmitter 101 that moves along a path 530 may not be received by the energy receiver 102, and may pass through the energy receiver 102. The portion passing through the energy receiver 102 may meet the first closed region of the magnetic shield 500 at a non-perpendicular angle along the path 530, and the portion that meets the first closed region of the magnetic shield 500 at the non-perpendicular angle may pass through the first closed region of the magnetic shield 500 along the path 530. In this example, the distance between the energy receiver 102 and the first closed region of the magnetic shield 500 may reduce the strength of the magnetic field that reaches the first closed region of the magnetic shield 500.

The portion of the magnetic field passing through the first closed region of the magnetic shield 500 may proceed into the free space along the path 530. In this example, the portion of the magnetic field proceeding into the free space may move to the inside of the magnetic field shielding apparatus again through the protrusion disposed in the first open region of the magnetic shield 500 along the path 530 by a shielding material having a higher permeability than the free space. Here, a portion of the magnetic field moving to the inside of the magnetic field shielding apparatus again may be received by the energy receiver 102, thereby increasing the reception efficiency of the energy receiver 102.

A portion of the magnetic field generated by the energy transmitter 101 that moves along a path 540 may not be received by the energy receiver 102, and may pass through the energy receiver 102. The portion passing through the energy receiver 102 may meet the first closed region of the magnetic shield 500 at a non-perpendicular angle, and the portion that meets the first closed region of the magnetic shield 500 at the non-perpendicular angle may be absorbed into the first closed region of the magnetic shield 500 along the path 540. In this example, the distance between the energy receiver 102 and the first closed region of the magnetic shield 500 may reduce the strength of the magnetic field that reaches the first closed region of the magnetic shield 500.

The portion of the magnetic field absorbed into the first closed region of the magnetic shield 500 may move to the inside of the magnetic field shielding apparatus again through the protrusion disposed in the first open region of the magnetic shield 500 along the path 540. Here, the portion of the magnetic field moving to the inside of the magnetic field shielding apparatus again may be received by the energy receiver 102, thereby increasing the reception efficiency of the energy receiver 102.

A portion of the magnetic field generated by the energy transmitter 101 that moves along a path 550 may not be received by the energy receiver 102, and may pass through the energy receiver 102. The portion passing through the energy receiver 102 may meet the first closed region of the magnetic shield 500 at a non-perpendicular angle, and the portion that meets the first closed region of the magnetic shield 500 at the non-perpendicular angle may pass through the first closed region of the magnetic shield 500 along the path 550. In this example, the distance between the energy receiver 102 and the first closed region of the magnetic shield 500 may reduce the strength of the magnetic field that reaches the first closed region of the magnetic shield 500.

The portion of the magnetic field passing through the first closed region of the magnetic shield 500 may proceed into the free space. In this example, the portion of the magnetic field proceeding into the free space may move to the inside of the magnetic field shielding apparatus through the first open region of the magnetic shield 500 along the path 550 by the shielding material having the higher permeability than the free space. Here, the portion of the magnetic field moving to the inside of the magnetic field shielding apparatus again may be received by the energy receiver 102, thereby increasing the reception efficiency of the energy receiver 102.

A portion of the magnetic field generated by the energy transmitter 101 that moves along a path 560 may not be received by the energy receiver 102, and may pass through the energy receiver 102. The portion passing through the energy receiver 102 may meet the first closed region of the magnetic shield 500 at a non-perpendicular angle along the path 560, and the portion that meets the first closed region of the magnetic shield 500 at the non-perpendicular angle may pass through the first closed region of the magnetic shield 500 along the path 560. In this example, the distance between the energy receiver 102 and the first closed region of the magnetic shield 500 may reduce the strength of the magnetic field that reaches the first closed region of the magnetic shield 500.

The portion of the magnetic field passing through the first closed region of the magnetic shield 500 along the path 560 may proceed into the free space. In this example, the portion of the magnetic field proceeding into the free space may move to the inside of the magnetic field shielding apparatus again through the protrusion disposed in the second open region of the magnetic shield 500 along the path 560 by the shielding material having the higher permeability than the free space. Here, the portion of the magnetic field moving to the inside of the magnetic field shielding apparatus again may be received by the energy receiver 102, thereby increasing the reception efficiency of the energy receiver 102.

A portion of the magnetic field generated by the energy transmitter 101 that moves along a path 570 may not be received by the energy receiver 102, and may pass through the energy receiver 102. The portion passing through the energy receiver 102 may meet the first closed region of the magnetic shield 500 at a non-perpendicular angle, and the portion that meets the first closed region of the magnetic shield 500 at the non-perpendicular angle may be absorbed into the first closed region of the magnetic shield 500 along the path 570. In this example, the distance between the energy receiver 102 and the first closed region of the magnetic shield 500 may reduce the strength of the magnetic field that reaches the first closed region of the magnetic shield 500.

The portion of the magnetic field absorbed into the first closed region of the magnetic shield 500 may move to the inside of the magnetic field shielding apparatus again through the protrusion disposed in the second open region of the magnetic shield 500 along the path 570. Here, the portion of the magnetic field moving to the inside of the magnetic field shielding apparatus again may be received by the energy receiver 102, thereby increasing the reception efficiency of the energy receiver 102.

A portion of the magnetic field generated by the energy transmitter 101 that moves along a path 580 may not be received by the energy receiver 102, and may pass through the energy receiver 102. The portion passing through the energy receiver 102 may meet the first closed region of the magnetic shield 500 at a non-perpendicular angle, and the portion that meets the first closed region of the magnetic shield 500 at the non-perpendicular angle may pass through the first closed region of the magnetic shield 500 along the path 580. In this example, the distance between the energy receiver 102 and the first closed region of the magnetic shield 500 may reduce the strength of the magnetic field that reaches the first closed region of the magnetic shield 500.

The portion of the magnetic field passing through the first closed region of the magnetic shield 500 may proceed into the free space. In this example, the portion of the magnetic field proceeding into the free space may move to the inside of the magnetic field shielding apparatus through the second open region of the magnetic shield 500 along the path 580 by the shielding material having the higher permeability than the free space. Here, the portion of the magnetic field moving to the inside of the magnetic field shielding apparatus again may be received by the energy receiver 102, thereby increasing the reception efficiency of the energy receiver 102.

Figure 6:
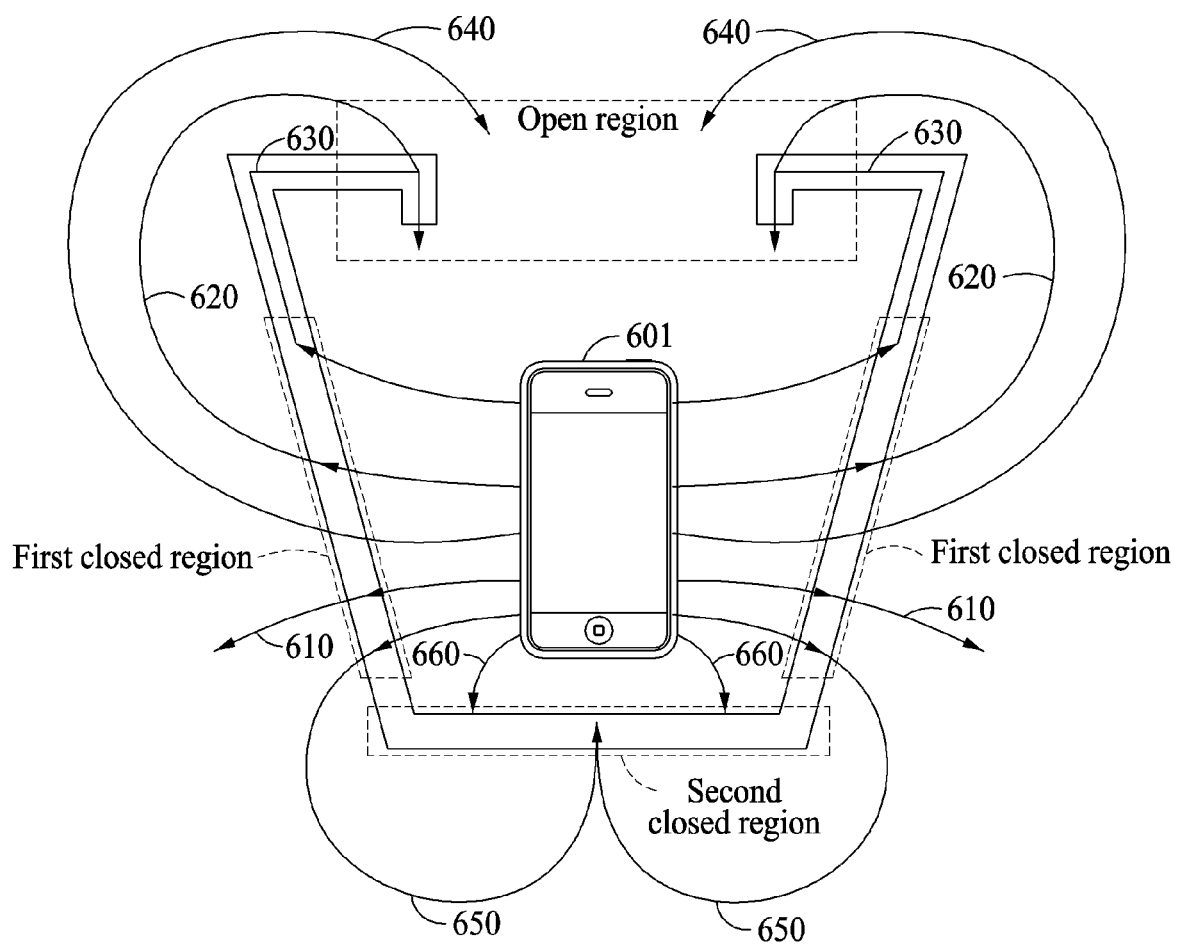
FIG. 6 illustrates a magnetic field shielding apparatus including a magnetic field generating apparatus according to an example embodiment.

FIG. 6 illustrates a magnetic field shielding apparatus including a magnetic field generating apparatus according to an example embodiment.

Referring to FIG. 6, a magnetic field shielding apparatus may include a magnetic shield 600, and a magnetic field generating apparatus 601. In an example, the magnetic field generating apparatus 601 may be a smart phone.

The magnetic shield 600 may include a first closed region, a second closed region, and an open region. For example, a cross section of the magnetic shield 600 may correspond to a trapezoidal shape such that a width of the open region is greater than a width of the second closed region. The first closed region may absorb or allow a magnetic field generated by the magnetic field generating apparatus 601 to pass.

The open region may enable the magnetic field being absorbed into the first closed region or passing through the first closed region to move to an inside of the magnetic field shielding apparatus again through a protrusion. Further, the magnetic field generating apparatus 601 may be inserted through the open region of the magnetic field shielding apparatus. The second closed region may enable the magnetic field passing through the first closed region to move to the inside of the magnetic field shielding apparatus again.

A portion of the magnetic field generated by the magnetic field generating apparatus that moves along a path 610 may perpendicularly meet the first closed region of the magnetic shield 600. The portion that perpendicularly meets the first closed region of the magnetic shield 600 may pass through the first closed region of the magnetic shield 600 along the path 610. Further, the portion passing through the first closed region of the magnetic shield 600 may move to a free space along the path 610.

A portion of the magnetic field generated by the magnetic field generating apparatus 601 that moves along a path 620 may meet the first closed region of the magnetic shield 600 at a non-perpendicular angle, and the portion that meets the first closed region of the magnetic shield 600 at the non-perpendicular angle may pass through the first closed region of the magnetic shield 600 along the path 620.

The portion of the magnetic field passing through the first closed region of the magnetic shield 600 may proceed into the free space along the path 620. In this example, the portion of the magnetic field proceeding into the free space may move to the inside of the magnetic field shielding apparatus again through the protrusion disposed in the open region of the magnetic shield 600 along the path 620 by a shielding material having a higher permeability than the free space.

A portion of the magnetic field generated by the magnetic field generating apparatus 601 that moves along a path 630 may meet the first closed region of the magnetic shield 600 at a non-perpendicular angle, and the portion that meets the first closed region of the magnetic shield 600 at the non-perpendicular angle may be absorbed into the first closed region of the magnetic shield 600 along the path 630.

The portion of the magnetic field absorbed into the first closed region of the magnetic shield 600 may move to the inside of the magnetic field shielding apparatus again through the protrusion disposed in the open region of the magnetic shield 600 along the path 630.

A portion of the magnetic field generated by the magnetic field generating apparatus 601 that moves along a path 640 may meet the first closed region of the magnetic shield 600 at a non-perpendicular angle, and the portion that meets the first closed region of the magnetic shield 600 at the non-perpendicular angle may pass through the first closed region of the magnetic shield 600 along the path 640.

The portion of the magnetic field passing through the first closed region of the magnetic shield 600 may proceed into the free space. In this example, the portion of the magnetic field proceeding into the free space may move to the inside of the magnetic field shielding apparatus through the open region of the magnetic shield 600 along the path 640 by the shielding material having the higher permeability than the free space.

A portion of the magnetic field generated by the magnetic field generating apparatus 601 that moves along a path 650 may meet the first closed region of the magnetic shield 600 at a non-perpendicular angle, and the portion that meets the first closed region of the magnetic shield 600 at the non-perpendicular angle may pass through the first closed region of the magnetic shield 600 along the path 650.

The portion of the magnetic field passing through the first closed region of the magnetic shield 600 may proceed into the free space. In this example, the portion of the magnetic field proceeding into the free space may move to the second closed region of the magnetic shield 600 along the path 650 by the shielding material having the higher permeability than the free space. Here, a portion of the magnetic field moving to the second closed region of the magnetic shield 600 that passes through the second closed region of the magnetic shield 600 may move to the inside of the magnetic field shielding apparatus again. A remaining portion of the magnetic field moving to the second closed region of the magnetic shield 600 that does not pass through the second closed region of the magnetic shield 600 may be absorbed into the second closed region of the magnetic shield 600.

A portion of the magnetic field generated by the magnetic field generating apparatus 601 that moves along a path 660 may meet the second closed region of the magnetic shield 600 at a non-perpendicular angle. The portion of the magnetic field that meets the second closed region of the magnetic shield 600 at the non-perpendicular angle may be absorbed into the second closed region of the magnetic shield 600 along the path 660.

Figure 7:
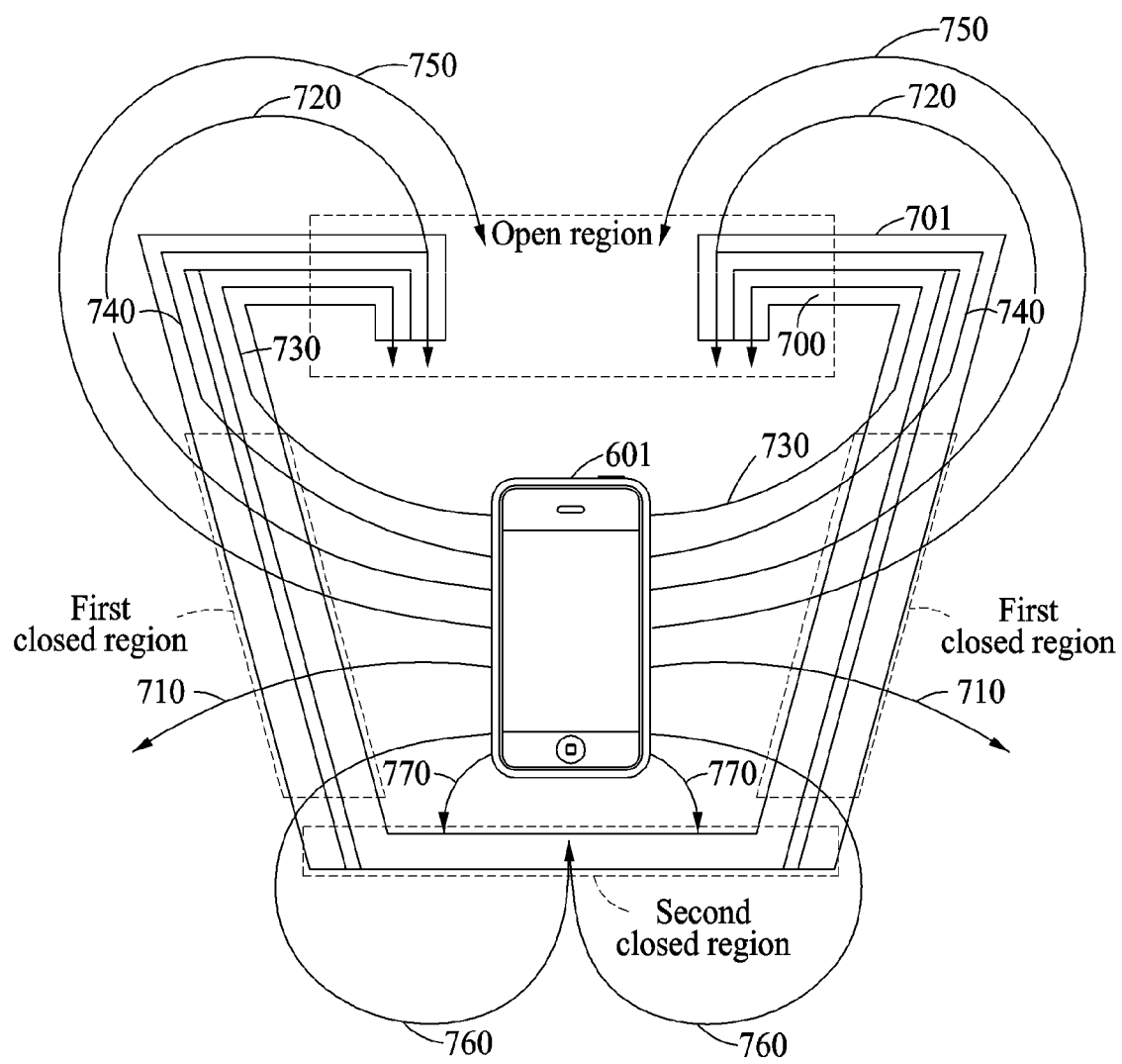
FIG. 7 illustrates a magnetic field shielding apparatus including a magnetic field generating apparatus and magnetic shields provided in a multilayer structure according to an example embodiment.

FIG. 7 illustrates a magnetic field shielding apparatus including a magnetic field generating apparatus and magnetic shields provided in a multilayer structure according to an example embodiment.

Referring to FIG. 7, a magnetic field shielding apparatus includes magnetic shields 700 and 701, and the magnetic field generating apparatus 601. In an example, the magnetic field generating apparatus 601 may be a smart phone. The magnetic shield 700 and the magnetic shield 701 may have different permeabilities. Further, a multilayer structure of the magnetic shields 700 and 701 may not be limited to shielding materials of a two-layer structure, and may include at least two layers of shielding materials having different permeabilities.

The magnetic shields 700 and 701 may each include a first closed region, a second closed region, and an open region. For example, a cross section of each of the magnetic shields 700 and 701 may correspond to a trapezoidal shape such that a width of the open region is greater than a width of the second closed region. The first closed region of the magnetic shield 700 may absorb or allow a magnetic field generated by the magnetic field generating apparatus 601 to pass.

The first closed region of the magnetic shield 701 may absorb or allow a magnetic field passing through the first closed region of the magnetic shield 700 to pass. In this example, a distance between the first closed region of the magnetic shield 700 and the first closed region of the magnetic shield 701 may reduce a strength of a leaked portion of the magnetic field that reaches the first closed region of the magnetic shield 701.

Further, the open region may enable the magnetic field absorbed into the first closed region of each of the magnetic shields 700 and 701 or passing through the first closed region of each of the magnetic shields 700 and 701 to move to an inside of the magnetic field shielding apparatus again through a protrusion. The magnetic field generating apparatus 601 may be inserted into the magnetic field shielding apparatus through the open region of the magnetic field shielding apparatus. The second closed region may enable the magnetic field passing through the first closed region to move to the inside of the magnetic field shielding apparatus again.

A portion of the magnetic field generated by the magnetic field generating apparatus 601 that moves along a path 710 may perpendicularly meet the first closed region of the magnetic shield 700. The portion that perpendicularly meets the first closed region of the magnetic shield 700 may pass through the first closed region of the magnetic shield 700 along the path 710. Further, the portion passing through the first closed region of the magnetic shield 700 that perpendicularly meets the first closed region of the magnetic shield 701 may pass through the first closed region of the magnetic shield 701 along the path 710. In this example, the distance between the first closed region of the magnetic shield 700 and the first closed region of the magnetic shield 701 may reduce a strength of the magnetic field that reaches the first closed region of the magnetic shield 701. The portion passing through the first closed region of the magnetic shield 701 may move to a free space along the path 710.

A portion of the magnetic field generated by the magnetic field generating apparatus 601 that moves along a path 720 may meet the first closed region of the magnetic shield 700 at a non-perpendicular angle, and the portion that meets the first closed region of the magnetic shield 700 at the non-perpendicular angle may pass through the first closed region of the magnetic shield 700 along the path 720.

The portion of the magnetic field passing through the first closed region of the magnetic shield 700 may meet the first closed region of the magnetic shield 701 at a non-perpendicular angle, and the portion that meets the first closed region of the magnetic shield 701 at the non-perpendicular angle may pass through the first closed region of the magnetic shield 701 along the path 720. In this example, the distance between the first closed region of the magnetic shield 700 and the first closed region of the magnetic shield 701 may reduce the strength of the magnetic field that reaches the first closed region of the magnetic shield 701.

The portion of the magnetic field passing through the first closed region of the magnetic shield 701 may proceed into the free space along the path 720. In this example, the portion of the magnetic field proceeding into the free space may move to the inside of the magnetic field shielding apparatus again through the protrusion disposed in the open region of the magnetic shield 701 along the path 720 by a shielding material having a higher permeability than the free space.

A portion of the magnetic field generated by the magnetic field generating apparatus 601 that moves along a path 730 may meet the first closed region of the magnetic shield 700 at a non-perpendicular angle, and the portion that meets the first closed region of the magnetic shield 700 at the non-perpendicular angle may be absorbed into the first closed region of the magnetic shield 700 along the path 730.

The portion of the magnetic field absorbed into the first closed region of the magnetic shield 700 may move to the inside of the magnetic field shielding apparatus again through the protrusion disposed in the open region of the magnetic shield 700 along the path 730.

A portion of the magnetic field generated by the magnetic field generating apparatus 601 that moves along a path 740 may meet the first closed region of the magnetic shield 700 at a non-perpendicular angle, and the portion that meets the first closed region of the magnetic shield 700 at the non-perpendicular angle may pass through the first closed region of the magnetic shield 700.

The portion of the magnetic field passing through the first closed region of the magnetic shield 700 may meet the first closed region of the magnetic shield 701 at a non-perpendicular angle, and the portion that meets the first closed region of the magnetic shield 701 at the non-perpendicular angle may be absorbed into the first closed region of the magnetic shield 701 along the path 740. In this example, the distance between the first closed region of the magnetic shield 701 and the first closed region of the magnetic shield 701 may reduce the strength of the magnetic field that reaches the first closed region of the magnetic shield 701.

The portion of the magnetic field absorbed into the first closed region of the magnetic shield 701 may move to the inside of the magnetic field shielding apparatus again through the protrusion disposed in the open region of the magnetic shield 701 along the path 740.

A portion of the magnetic field generated by the magnetic field generating apparatus 601 that moves along a path 750 may meet the first closed region of the magnetic shield 700 at a non-perpendicular angle, and the portion that meets the first closed region of the magnetic shield 700 at the non-perpendicular angle may pass through the first closed region of the magnetic shield 700 along the path 750.

The portion of the magnetic field passing through the first closed region of the magnetic shield 700 may meet the first closed region of the magnetic shield 701 at a non-perpendicular angle, and the portion that meets the first closed region of the magnetic shield 701 at the non-perpendicular angle may pass through the first closed region of the magnetic shield 701 along the path 750. In this example, the distance between the first closed region of the magnetic shield 700 and the first closed region of the magnetic shield 701 may reduce the strength of the magnetic field that reaches first closed region of the magnetic shield 701.

Further, the portion of the magnetic field passing through the first closed region of the magnetic shield 701 may proceed into the free space. In this example, the portion of the magnetic field proceeding into the free space may move to the inside of the magnetic field shielding apparatus through the open region of each of the magnetic shields 700 and 701 along the path 750 by the shielding material having the higher permeability than the free space.

A portion of the magnetic field generated by the magnetic field generating apparatus 601 that moves along a path 760 may meet the first closed region of the magnetic shield 700 at a non-perpendicular angle, and the portion that meets the first closed region of the magnetic shield 700 at the non-perpendicular angle may pass through the first closed region of the magnetic shield 700 along the path 760.

The portion of the magnetic field passing through the first closed region of the magnetic shield 700 may meet the first closed region of the magnetic shield 701 at a non-perpendicular angle, and the portion that meets the first closed region of the magnetic shield 701 at the non-perpendicular angle may pass through the first closed region of the magnetic shield 701 along the path 760. In this example, the distance between the first closed region of the magnetic shield 700 and the first closed region of the magnetic shield 701 may reduce the strength of the magnetic field that reaches the first closed region of the magnetic shield 701.

The portion of the magnetic field passing through the first closed region of the magnetic shield 701 may proceed into the free space. In this example, the portion of the magnetic field proceeding into the free space may move to the second closed region of the magnetic shield 700 along the path 760 by the shielding material having the higher permeability than the free space. Here, a portion of the magnetic field moving to the second closed region of the magnetic shield 700 that passes through the second closed region of the magnetic shield 700 may move to the inside of the magnetic field shielding apparatus again. A portion of the magnetic field moving to the second closed region of the magnetic shield 700 that does not pass through the second closed region of the magnetic shield 700 may be absorbed into the second closed region of the magnetic shield 700.

A portion of the magnetic field generated by the magnetic field generating apparatus 601 that moves along a path 770 may meet the second closed region of the magnetic shield 700 at a non-perpendicular angle. The portion that meets the second closed region of the magnetic shield 700 at the non-perpendicular angle may be absorbed into the second closed region of the magnetic shield 700 along the path 770.

Figure 8:
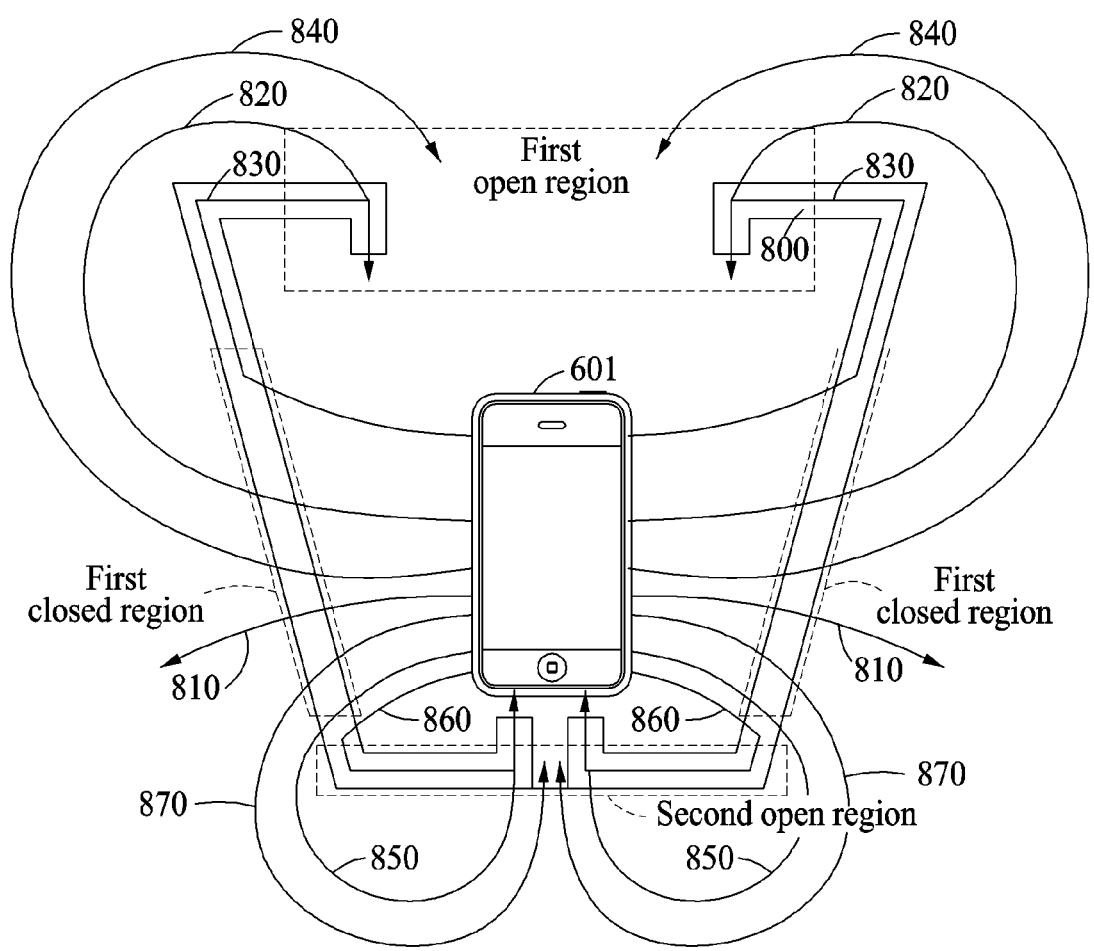
FIG. 8 illustrates a magnetic field shielding apparatus including a magnetic field generating apparatus and a magnetic shield having at least two open regions according to an example embodiment.

FIG. 8 illustrates a magnetic field shielding apparatus including a magnetic field generating apparatus and a magnetic shield having at least two open regions according to an example embodiment.

Referring to FIG. 8, a magnetic field shielding apparatus may include a magnetic shield 800, and the magnetic field generating apparatus 601. In an example, the magnetic field generating apparatus 601 may be a smart phone.

The magnetic shield 800 may include a first closed region, a first open region, and a second open region. For example a cross section of the magnetic shield 800 may correspond to a trapezoidal shape such that a width of the first open region is greater than a width of the second open region. The first closed region may absorb or allow a magnetic field generated by the magnetic field generating apparatus 601.

The first open region and the second open region may each enable the magnetic field being absorbed into the first closed region or passing through the first closed region to move to an inside of the magnetic field shielding apparatus again through a protrusion. Further, the magnetic field generating apparatus 601 may be inserted through the first open region of the magnetic field shielding apparatus.

A portion of the magnetic field generated by the magnetic field generating apparatus 601 that moves along a path 810 may perpendicularly meet the first closed region of the magnetic shield 800. The portion that perpendicularly meets the first closed region of the magnetic shield 800 may pass through the first closed region of the magnetic shield 800 along the path 810. Further, the portion passing through the first closed region of the magnetic shield 800 may move to a free space along the path 810.

A portion of the magnetic field generated by the magnetic field generating apparatus 601 that moves along a path 820 may meet the first closed region of the magnetic shield 800 at a non-perpendicular angle, and the portion that meets the first closed region of the magnetic shield 800 at the non-perpendicular angle may pass through the first closed region of the magnetic shield 800 along the path 820.

The portion of the magnetic field passing through the first closed region of the magnetic shield 800 may proceed into the free space along the path 820. In this example, the portion of the magnetic field proceeding into the free space may move to the inside of the magnetic field shielding apparatus again through a protrusion disposed in the first open region of the magnetic shield 800 along the path 820 by a shielding material having a higher permeability than the free space.

A portion of the magnetic field generated by the magnetic field generating apparatus 601 that moves along a path 830 may meet the first closed region of the magnetic shield 800 at a non-perpendicular angle, and the portion that meets the first closed region of the magnetic shield 800 at the non-perpendicular angle may be absorbed into the first closed region of the magnetic shield 800 through the path 830.

The portion of the magnetic field absorbed into the first closed region of the magnetic shield 800 may move to the inside of the magnetic field shielding apparatus again through the protrusion disposed in the first open region of the magnetic shield 800 along the path 830.

A portion of the magnetic field generated by the magnetic field generating apparatus 601 that moves along a path 840 may meet the first closed region of the magnetic shield 800 at a non-perpendicular angle, and the portion that meets the first closed region of the magnetic shield 800 at the non-perpendicular angle may pass through the first closed region of the magnetic shield 800 along the path 840.

The portion of the magnetic field passing through the first closed region of the magnetic shield 800 may proceed into the free space. In this example, the portion of the magnetic field proceeding into the free space may move to the inside of the magnetic field shielding apparatus through the first open region of the magnetic shield 800 along the path 840 by the shielding material having the higher permeability than the free space.

A portion of the magnetic field generated by the magnetic field generating apparatus 601 that moves along a path 850 may meet the first closed region of the magnetic shield 800 at a non-perpendicular angle, and the portion that meets the first closed region of the magnetic shield 800 at the non-perpendicular angle may pass through the first closed region of the magnetic shield 800 along the path 850.

The portion of the magnetic field passing through the first closed region of the magnetic shield 800 may proceed into the free space along the path 850. In this example, the portion of the magnetic field proceeding into the free space may move to the inside of the magnetic field shielding apparatus again through a protrusion disposed in the second open region of the magnetic shield 800 along the path 850 by the shielding material having the higher permeability than the free space.

A portion of the magnetic field generated by the magnetic field generating apparatus 601 that moves along a path 860 may meet the first closed region of the magnetic shield 800 at a non-perpendicular angle, and the portion that meets the first closed region of the magnetic shield 800 at the non-perpendicular angle may be absorbed into the first closed region of the magnetic shield 800 along the path 860.

The portion of the magnetic field absorbed into the first closed region of the magnetic shield 800 may move to the inside of the magnetic field shielding apparatus again through the protrusion disposed in the second open region of the magnetic shield 800 along the path 860.

A portion of the magnetic field generated by the magnetic field generating apparatus 601 that moves along a path 870 may meet the first closed region of the magnetic shield 800 at a non-perpendicular angle, and the portion that meets the first closed region of the magnetic shield 800 at the non-perpendicular angle may pass through the first closed region of the magnetic shield 800 through the path 870.

The portion of the magnetic field passing through the first closed region of the magnetic shield 800 may proceed into the free space. In this example, the portion of the magnetic field proceeding into the free space may move to the inside of the magnetic field shielding apparatus through the second open region of the magnetic shield 800 along the path 870 by the shielding material having the higher permeability than the free space.

The components described in the exemplary embodiments of the present invention may be achieved by hardware components including at least one Digital Signal Processor (DSP), a processor, a controller, an Application Specific Integrated Circuit (ASIC), a programmable logic element such as a Field Programmable Gate Array (FPGA), other electronic devices, and combinations thereof. At least some of the functions or the processes described in the exemplary embodiments of the present invention may be achieved by software, and the software may be recorded on a recording medium. The components, the functions, and the processes described in the exemplary embodiments of the present invention may be achieved by a combination of hardware and software.

The processing device described herein may be implemented using hardware components, software components, and/or a combination thereof. For example, the processing device and the component described herein may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor, or any other device capable of responding to and executing instructions in a defined manner.

The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A magnetic field shielding apparatus, comprising:
an energy transmitter configured to generate a magnetic field;
an energy receiver configured to receive the magnetic field generated by the energy transmitter; and
a magnetic shield configured to shield a leaked magnetic field that is not received by the energy receiver and is pass through the energy receiver,
wherein the magnetic shield comprises:
(i) a closed region includes
a first closed region into which the leaked magnetic field is absorbed or through which the leaked magnetic field passes from the inside of the magnetic field shielding apparatus to an outside thereof; and
a second closed region through which the magnetic field passing through the first closed region passes from the outside of the magnetic field shielding apparatus to the inside thereof
(ii) at least one open region has a protrusion configured to move the leaked magnetic field which is absorbed by the closed region or which is pass through the closed region to an inside of the magnetic field shielding apparatus again,
wherein the protrusion is disposed in the open region toward the inside of the magnetic field shielding apparatus,
wherein the open region enables the magnetic field being absorbed into the first closed region to move to an inside of the magnetic field shielding apparatus again through the protrusion,
wherein a portion of the magnetic field generated by the energy transmitter meets the first closed region of the magnetic shield at a non-perpendicular angle, passes through the first closed region of the magnetic shield to a free space, and moves to the inside of the magnetic field shielding apparatus again through the protrusion disposed in the open region of the magnetic shield due to a shielding material having a higher permeability than the free space.

2. The magnetic field shielding apparatus of claim 1, wherein a portion of the open region through which an electronic device configured to obtain energy from the energy transmitter and the energy receiver is to be inserted is configured to have a greater width than a remaining portion of the open region.

3. The magnetic field shielding apparatus of claim 1, wherein the protrusion is configured to protrude toward the inside of the magnetic field shielding apparatus within a range not interfering with the magnetic field that moves from the energy transmitter to the energy receiver.

4. The magnetic field shielding apparatus of claim 1, wherein the magnetic shield is provided in a multilayer structure in which one or more shielding materials having different permeabilities are alternately disposed.

5. The magnetic field shielding apparatus of claim 4, wherein the shielding materials are disposed at a preset interval to be spaced apart from each other.

6. The magnetic field shielding apparatus of claim 1, wherein the energy transmitter and the energy receiver each are disposed at a preset interval to be spaced apart from the magnetic shield.

7. The magnetic field shielding apparatus of claim 1, wherein the energy receiver is configured to receive a portion of the leaked magnetic field that moves from an outside of the magnetic field shielding apparatus to the inside thereof through the open region.

8. A magnetic field shielding apparatus, comprising:
a magnetic shield configured to shield a magnetic field generated by a magnetic field generating apparatus disposed in the magnetic field shielding apparatus,
wherein the magnetic shield comprises:
(i) a closed region includes
a first closed region into which the leaked magnetic field is absorbed or through which the leaked magnetic field passes from the inside of the magnetic field shielding apparatus to an outside thereof; and a second closed region through which the magnetic field passing through the first closed region passes from the outside of the magnetic field shielding apparatus to the inside thereof, (ii) at least one open region has a protrusion configured to move the leaked magnetic field which is absorbed by the closed region or which is pass through the closed region to an inside of the magnetic field shielding apparatus again, wherein the protrusion is disposed in the open region toward the inside of the magnetic field shielding apparatus, wherein the open region enables the magnetic field being absorbed into the first closed region to move to an inside of the magnetic field shielding apparatus again through the protrusion, wherein a portion of the magnetic field generated by the magnetic field generating apparatus meets the first closed region of the magnetic shield at a non-perpendicular angle, passes through the first closed region of the magnetic shield to a free space, and moves to the inside of the magnetic field shielding apparatus again through the protrusion disposed in the open region of the magnetic shield due to a shielding material having a higher permeability than the free space.

9. The magnetic field shielding apparatus of claim 8, wherein a portion of the open region through which the magnetic field generating apparatus is to be inserted is configured to have a greater width than a remaining portion of the open region.

10. The magnetic field shielding apparatus of claim 8, wherein the magnetic shield is provided in a multilayer structure in which one or more shielding materials having different permeabilities are alternately disposed.

11. The magnetic field shielding apparatus of claim 10, wherein the shielding materials are disposed at a preset interval to be spaced apart from each other.

* * * * *